(12) United States Patent  
Chih

(10) Patent No.: US 7,269,063 B2
(45) Date of Patent: Sep. 11, 2007

(54) FLOATING GATE MEMORY WITH SPLIT-GATE READ TRANSISTOR AND SPLIT GATE PROGRAM TRANSISTOR MEMORY CELLS AND METHOD FOR MAKING THE SAME

(75) Inventor: Yeu-Der Chih, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 11/433,653

(22) Filed: May 12, 2006

(65) Prior Publication Data

US 2006/0221682 A1   Oct. 5, 2006

Related U.S. Application Data

(62) Division of application No. 10/785,552, filed on Feb. 24, 2004, now Pat. No. 7,072,215.

(51) Int. Cl.
*G11C 16/04* (2006.01)

(52) U.S. Cl. .............................. 365/185.1; 365/185.05; 365/185.23

(58) Field of Classification Search ............. 365/185.1, 365/185.05, 185.23
See application file for complete search history.

(56) References Cited

U.S. PATENT DOCUMENTS

| 5,033,023 | A | 7/1991 | Hsia et al. |
| 5,357,466 | A * | 10/1994 | Hong ..................... 365/185.3 |
| 5,544,103 | A | 8/1996 | Lambertson |
| 5,812,452 | A | 9/1998 | Hoang |
| 5,909,387 | A | 6/1999 | Wong et al. |
| 6,088,269 | A | 7/2000 | Lambertson |
| 6,121,087 | A | 9/2000 | Mann et al. |
| 6,128,220 | A | 10/2000 | Bangai et al. |
| 6,317,349 | B1 * | 11/2001 | Wong ......................... 365/49 |
| 6,376,876 | B1 | 4/2002 | Shin et al. |
| 6,377,498 | B1 | 4/2002 | Kang |
| 6,400,603 | B1 | 6/2002 | Blyth et al. |
| 6,765,825 | B1 * | 7/2004 | Scott ..................... 365/185.01 |
| 6,781,187 | B2 | 8/2004 | Owa |
| 6,888,755 | B2 | 5/2005 | Harari |
| 2002/0171102 | A1 | 11/2002 | Shizukuishi |
| 2004/0190360 | A1 * | 9/2004 | Scheuerlein ............. 365/225.7 |

* cited by examiner

*Primary Examiner*—Huan Hoang
(74) *Attorney, Agent, or Firm*—Duane Morris LLP

(57) ABSTRACT

Variations in memory array and cell configuration are shown, which eliminate punch-through disturb, reverse-tunnel. Several configurations are shown which range from combined and separate source lines for each row of cells, a two transistor cell containing a read transistor and a program transistor connected by a merged floating gate, and a two transistor cell where the program transistor has an extra implant to raise the Vt of the transistor to protect against punch-through disturb. A method is also described to rewrite disturbed cells, which were not selected to be programmed.

12 Claims, 6 Drawing Sheets

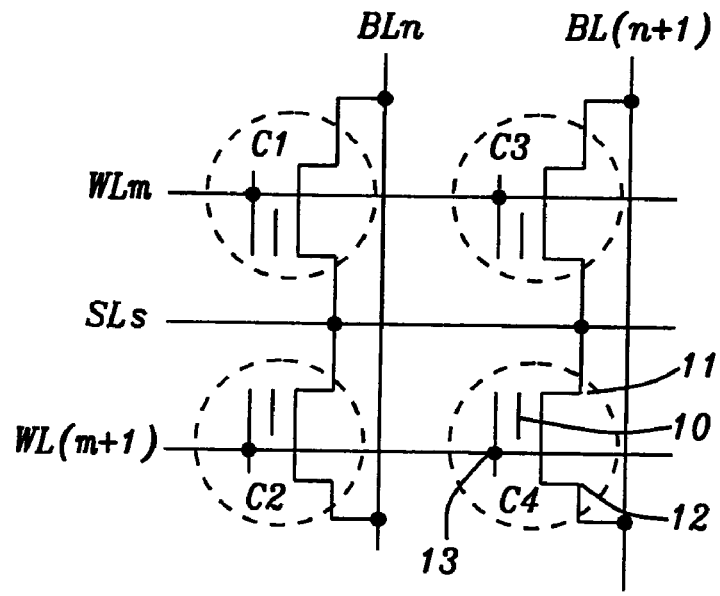
*FIG. 1 — Prior Art*
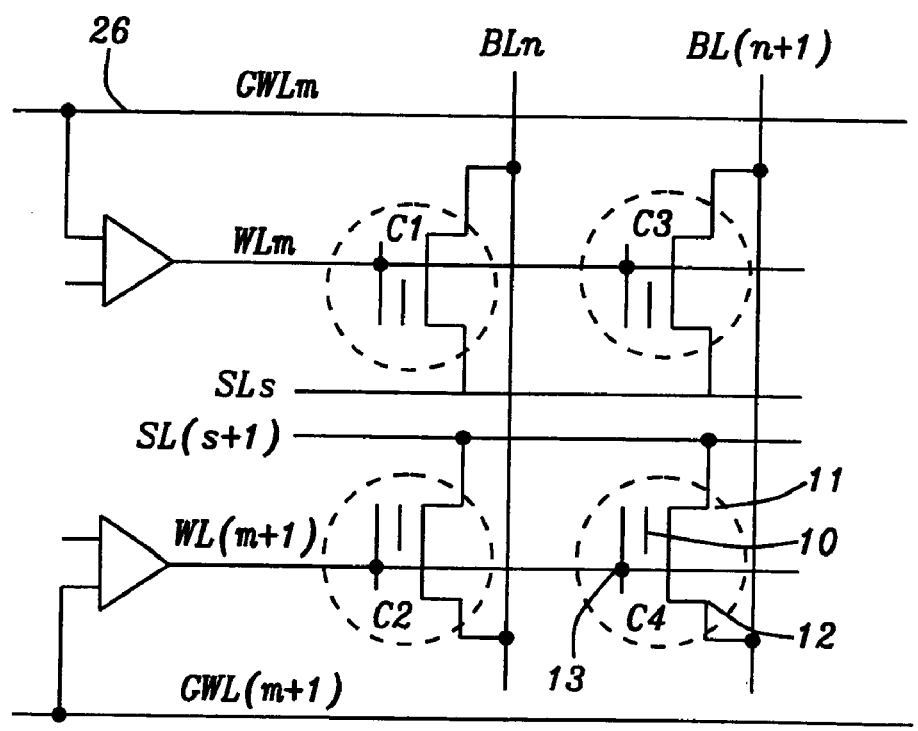
*FIG. 2*

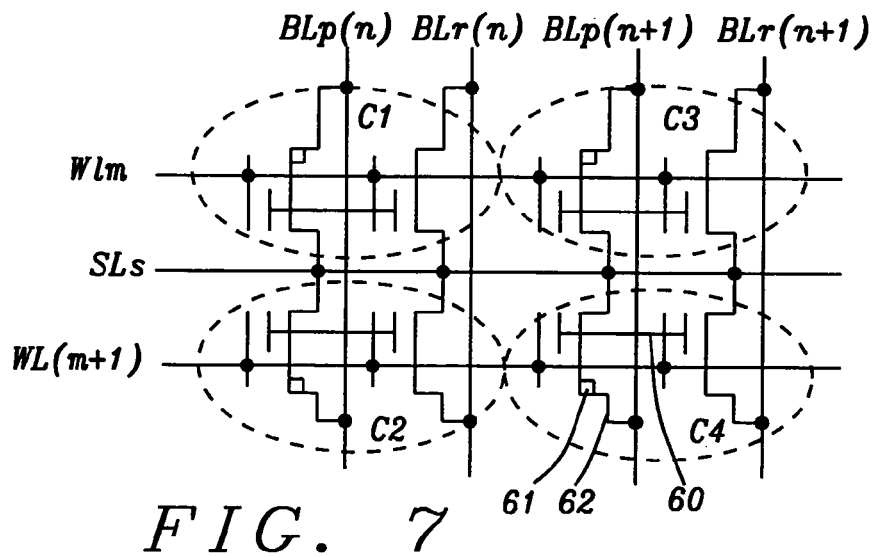
FIG. 7
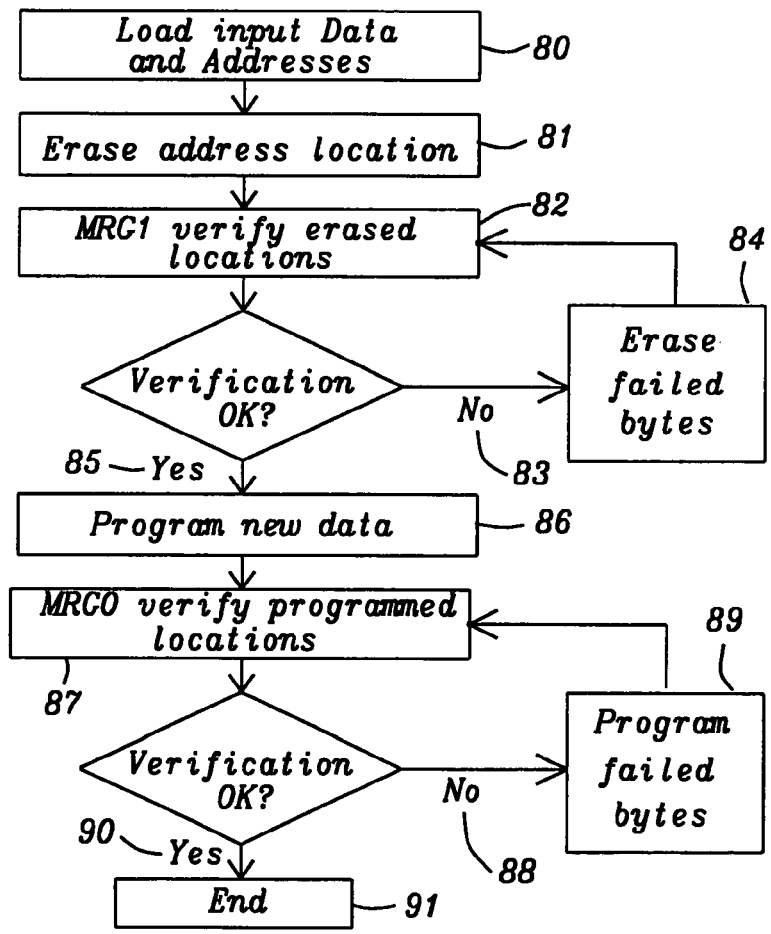
FIG. 8 – Prior Art

FLOATING GATE MEMORY WITH SPLIT-GATE READ TRANSISTOR AND SPLIT GATE PROGRAM TRANSISTOR MEMORY CELLS AND METHOD FOR MAKING THE SAME

RELATED APPLICATION

This application is a divisional of application Ser. No. 10/785,552 filed Feb. 24, 2004, now U.S. Pat. No. 7,072,215, the contents of which are herein incorporated by reference as if set forth in their entirety.

BACKGROUND OF THE INVENTION

1. Field of Invention

The present invention relates to semiconductor memory and in particular to an array structure using split gate transistor cells and providing ways to avoid reverse-tunnel-disturb and punch through-disturb as well as a method to re-write cells that are feed forward disturbed.

2. Description of Related Art

Applications such as data memory or smart card require a byte alterable memory. These applications are cost sensitive and require that the byte alterable capability be implemented at a minimum cost. In order to keep a byte alterable memory compact, an array architecture is required that provides a compact memory and eliminates any resulting disturb conditions. Creating a byte alterable memory, in general, requires segmentation of word lines and source lines, which in turn adds to the amount of semiconductor real estate required to implement the byte alterable memory.

U.S. Pat. No. 6,376,876 B1 (Shin et al.) is directed to a NAND type flash memory array that uses a low resistance common source line with low aspect ratio bit line contact holes. In U.S. Pat. No. 6,400,603 B1 (Blyth et al.) a flash EEPROM array is directed to the reduced size of blocks or pages that are to be erased in a write or an erase operation. U.S. Pat. No. 6,128,220 (Banyai et al.) is directed to a flash memory device that provides a byte-alterable nonvolatile memory. U.S. Pat. No. 6,121,087 (Mann et al.) is directed to an integrated circuit device with an embedded EEPROM memory. U.S. Pat. No. 6,088,269 (Lambertson) is directed to a compact page erasable EEPROM without the use of the control gate to improve electron tunneling efficiency during programming. U.S. Pat. No. 5,812,452 (Hoang) is directed to a byte selectable and byte alterable memory array. U.S. Pat. No. 5,544,103 (Lambertson) is directed to a compact, electrically erasable and programmable nonvolatile memory device which has unique programming and erasing techniques in which the control gate is eliminated as a means for improving electron tunneling efficiency. In U.S. Pat. No. 5,033,023 an EEPROM is directed to a byte erase operation.

In an array using floating gate transistors connected by a common source line between adjacent rows and a common bit line connected between cells in a column, a program disturb is possible for erased cells. The program disturb can be either a punch-through disturb or a reverse-tunnel-disturb. The punch-through disturb can occur in an erased cell that shares a common source line and bit line with a cell being programmed. The punch-through disturb will cause the disturbed cell, which has been erased, to be weakly programmed since there is non-zero channel current. The non-zero channel current will change the disturbed cell from an erased state (logical "1") to a programmed state (logical "0") after several iterations. The reverse-tunnel-disturb can occur in unselected erased cells within a page during programming, but located on the adjacent row of a selected page. The voltage on the common source line is couple by capacitance to the floating gate of the unselected cell. If a defect exists in the oxide separating the floating gate and the control gate, Fowler-Nordheim tunneling can occur, which could program the unselected cell.

Referring to FIG. 1 of prior art, if cell C1 is programmed then cell C2 can suffer punch-through disturb (common source line and common bit line). Cell C4 can suffer reverse tunneling disturb (common source line but not common bit line) when cell C1 is programmed, and cell C3 can suffer feed forward (FF) disturb (common source line and common word line)

SUMMARY OF THE INVENTION

It is an objective of the present invention to provide an array comprising cells containing multiple split gate transistors with a merged floating gate between at least two split gate transistors, wherein the cells are connected together with a common source line, common read bit lines between odd and even cells and separate program bit lines between odd and even cells.

It is another objective of the present invention to byte select each word line for erase of the multiple transistor cells.

It is another objective of the present invention to form array cells from two-transistor split gate cells, wherein each cell contains a merged floating gate between the two-transistors.

It is another objective of the present invention to form array cells from three-transistor split gate cells, wherein each cell contains a merged floating gate between two of the three transistors.

It is another objective of the present invention to eliminate punch-through disturb and reverse tunnel disturb conditions in a split gate memory array.

It is also an objective of the present invention to provide a multiple transistor split gate cell with an added implant in the programming transistor to increase threshold voltage to prevent punch through disturb.

It is also another objective of the present invention to provide a split gate transistor cell memory array that has a common source line for odd and even cells in a memory page.

It is also yet another objective of the present invention to provide a common read bit line for odd and even cells in a memory page.

It is also still another objective of the present invention to provide separate program bit lines for odd and even cells in a memory page.

It is still another objective of the present invention to provide a read bit line separate from a program bit line.

It is yet another objective of the present invention to byte select each word line for erase of split gate transistor cells.

It is still yet another objective of the present invention to implement a "rewrite if disturbed" algorithm.

Whereas the present invention is oriented to providing a byte alterable nonvolatile memory array, the features of the present invention are applicable to other lengths of alterability. Providing byte alterability implies a byte erase capability, which requires that the word line be segmented into byte lengths for the erase function. This adds word line drivers to each byte length of the word line. Cells with an odd address are connected to an odd addressed word line and even addressed cells are connected to an adjacent even addressed word line. Bit lines then connect between the odd and even addressed cells in a column of the same byte. In the present invention, if the cell contains only one split gate transistor, separate source lines are provided for the odd and even rows of memory cells to minimize program disturb conditions. The source lines connect to a plurality of word line segments in a memory row.

The need to have a separate source lines for odd and even addressed cells is eliminated by a cell that is connected to a program bit line and a read bit line. The two bit lines connect to two separate split gate transistors (a program transistor and a read transistor) in which the floating gate is shared between the two transistors by merging the floating gate for the program transistor with the floating gate of the read transistor. Punch-through disturb is eliminated in cells containing the two transistors with merged floating gates which are connected to a common source line because the cells are arranged such that there is not a common program bit line for cells with a common source line. Applying approximately 1.8V on the unselected word line eliminates reverse tunneling.

In another embodiment of the present invention the program transistor of a merged floating gate two transistor pair has an added implant to raise the Vt of the program transistor. This added implant increases the Vt (threshold voltage) of the program transistor and prevents punch through on the program transistor. Since the program transistor is not used for reading, the cell current can be small allowing the higher Vt. The word line voltage may need to be raised and as a result the difference between word line inhibit voltage and word line read voltage is increased.

In another embodiment an algorithm to re-write, if a cell is disturbed, fixes program feed forward (FF) disturb problems. Input data and addresses are loaded into a page buffer, and original data from the array is read into the page buffer. Then memory cells are erased using a marginal read of a logical "1" (MRG1) to verify the erase operation. Any segment of data, such as a byte, that has failed being erased is then re-erased. Next selected bits are programmed and verified with a marginal read of a logical "0" (MRG0). Any bits that fail MRG0 are reprogrammed. Then the unchanged portion of the data is verified with a MRG1. If the MRG1 of the unchanged portion is a pass condition the procedure is finished. Otherwise rewrite the unchanged cells with data that was read out form the array into the page buffer. The rewrite includes an initial erase operation, then a program operation followed by a verify operation.

BRIEF DESCRIPTION OF THE DRAWINGS

This invention will be described with reference to the accompanying drawings, wherein:

FIG. 1 is a schematic diagram of prior art for a portion of a nonvolatile memory array with a common source line, FIG. 2 is a schematic diagram of the present invention showing a portion of a nonvolatile memory with separated source lines, FIG. 7 is a schematic diagram of the present invention for a portion of a nonvolatile memory array for two-transistor cell connected to the same source line, FIG. 8 is a flow diagram of prior art for programming new data into a memory array of nonvolatile cells.

DETAILED DESCRIPTION OF THE PREFERRED EMBODIMENT

Figure 3:
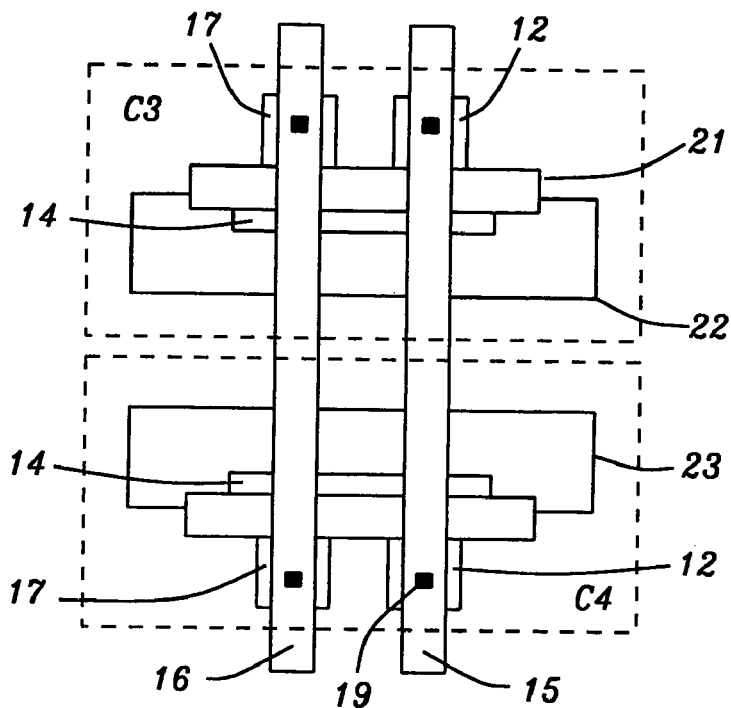
FIG. 3 is a plan view of the present invention for a cell layout for two-transistor memory cells connected to separate source.

In FIG. 1 a schematic diagram of prior art is shown of a portion of a memory array comprising cells of a split gate transistor containing a floating gate 10 and a control gate 13. The control gate 13 of the odd designated cells C1 and C3 are connected to a word line WLm and the control gate 13 of the even designated cells C2 and C4 are connected to a word line WL(m+1). The sources 11 of the split gate transistors are connected to a common source line SLs. The drain 11 of the transistors in cells C1 and C2 are connected to bit line BLn, and the drain 11 of the transistors in cells C3 and C4 are connected to bit line BL(n+1).

Continuing to refer to FIG. 1 of prior art, if cell C3 is being programmed, a high voltage, approximately +10V, is applied to the source line SLs, a voltage of approximately +1.8V is applied to word line WLm, Vss or ground is applied to word line WL(m+1), bit line BLn is coupled to VCC and bit line BL(n+1) is coupled to approximately +0.6V. Under these conditions cell C4 is exposed to punch-through disturb. If cell C4 is erased and a defect reduced the channel length under the selected gate of cell C3, then hot electrons become available to program the unselected and inhibited cell C4. Under the same voltage conditions noted above for programming cell C3, cell C2 is exposed to reverse tunneling. The reverse-tunnel-disturb can occur in unselected erased cells within a page during programming, but located on the adjacent row of a selected page. The voltage +10V on the common source line SLs is couple by capacitance to the floating gate 10 of the unselected cell C2. If a defect exists in the oxide separating the floating gate 10 and the control gate 13, Fowler-Nordheim tunneling can occur, which could program the unselected cell C2. Under the same conditions cell C1 can suffer from a feed forward (FF) disturb. The FF disturb is another form of punch-through disturb, which occurs when the word line voltage is high (approximately 1.8V), the bit line voltage is at VCC and the source line voltage is approximately 10V. Under these conditions there will be a small channel current flowing in cell C1 which will cause a weak programming of the unselected cell.

In FIG. 2 is shown a portion of a memory array of a first embodiment of the present invention containing cells C1, C2, C3, and C4 with a single split gate transistor. The control gates 13 of the odd designated cells C1 and C3 are coupled to a local word line WLm and the control gates 13 of the even designated cells C2 and C4 are coupled to a local word line WL(m+1). The local word lines WLm and WL(m+1) are driven by word line drivers 25 which are connected to global word lines GWLm and GWL(m+1). The global word line 26 can be effectively segmented into small segments such as a byte length using a plurality of word line drivers 25 along a row of memory cells to drive each segment of cells. The source line connecting the odd cells and the even cells are separated into a source line SLs coupled to cells C1 and C3 and source line SL(s+1) coupled to cells C2 and C4. If cell C3 is selected to be programmed, The selected local word line WLm voltage is at approximately +1.8V, the voltage of unselected word line WL(m+1) is VSS or ground, the source line SLs voltage connected to the selected cell C3 is +10V and the source line SL(s+1) voltage connected to the unselected cells C2 and C4 is VSS or ground. The source line separation eliminates the punch-through and reverse-tunnel disturb conditions on the unselected cells by removing the high source line voltage from the cells C2 and C4 in the unselected row.

Figure 4:
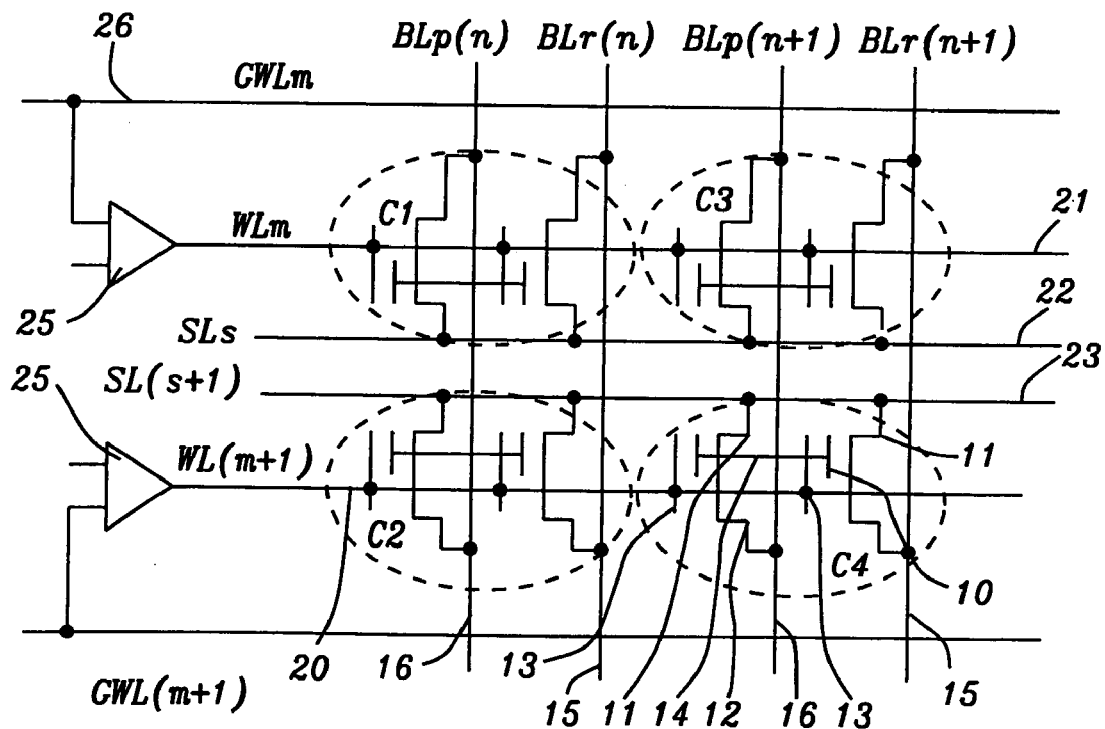
FIG. 4 is a schematic diagram of the present invention for a portion of a nonvolatile memory array for two-transistor cells connected to separate source.

The second embodiment of the present invention is described with respect to FIG. 3 and FIG. 4. FIG. 3 shows the plan view of the layout of two vertically adjacent cells C3 and C4. FIG. 4 shows a schematic diagram of a portion of an array of nonvolatile cells C1, C2, C3 and C4. The reference numbers in FIG. 3 and FIG. 4 correspond to each other and will be used to describe the layout and interconnections of the cells.

Figure 9:
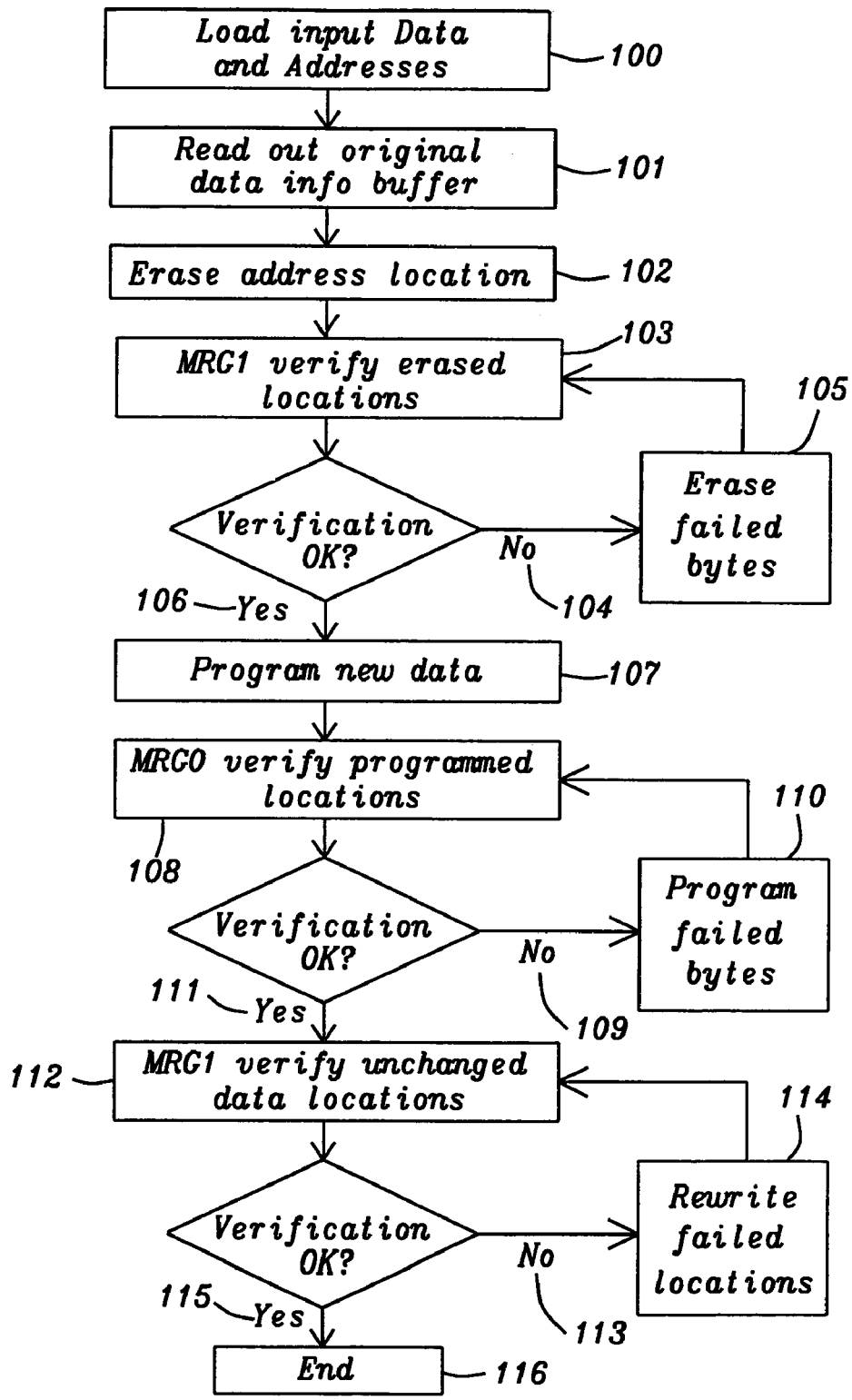
FIG. 9 is a flow diagram of the present invention for programming new data into a memory array of nonvolatile cells.

Continuing to reference FIGS. 3 and 4, each cell C1, C2, C3 and C4 comprise two split gate transistors that are coupled together by a shared, or merged, floating gate 14. Two bit lines 15 and 16 connect between cells in a column, which are connected to the drains 12 of the transistors by contacts 19. Cells C1 and C2 are connected by bit lines BLp(n) 16, a program bit line, and BLr(n) 15, a read bit line. Cells C3 and C4 are connected by bit lines BLp(n+1) 16, a program bit line, and BLr(n+1) 15, a read bit line. A word line WLm 21 connects to the control gates 13 in a row of cells containing cells C1 and C3, and a word line WL(m+1) 20 connects to the control gates 13 in a row of cells containing cells C2 and C4. Each word line is driven by a word line driver 25 that is connected to global word lines GWLm and GWL(m+1), and a plurality of word line drivers 25 are used in each row to drive addressable segments that are smaller than the full row length, such as a byte. The source line SLs 22 is coupled to sources 11 of the transistors of the cells in the row represented by cells C1 and C3, and a separate source line SL(s+1) 23 is coupled to sources 11 of the transistors of the cells in the row represented by cells C2 and C4. The separate source lines SLs and SL(s+1) prevent reverse-tunnel disturb and punch-through disturb. FF disturb is not prevented, and if FF disturb occurs, a "rewrite failed locations" 114 algorithm is used to correct the effect as shown in FIG. 9.

Still referring to FIGS. 3 and 4, according to another exemplary embodiment (not illustrated) the read bit line BLr(n) 15 and the program bit line BL(n) 16 may be merged into one line connecting between memory cells in a column.

Figure 5A:
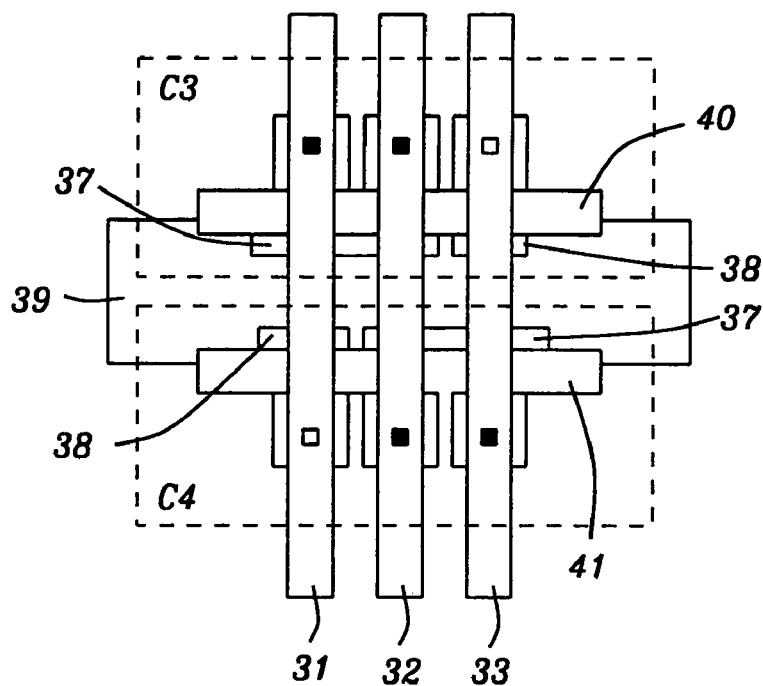
FIGS. 5A and 5B are plan views of the present invention for a cell layout for two transistor memory cells connected to the same source.
Figure 6:
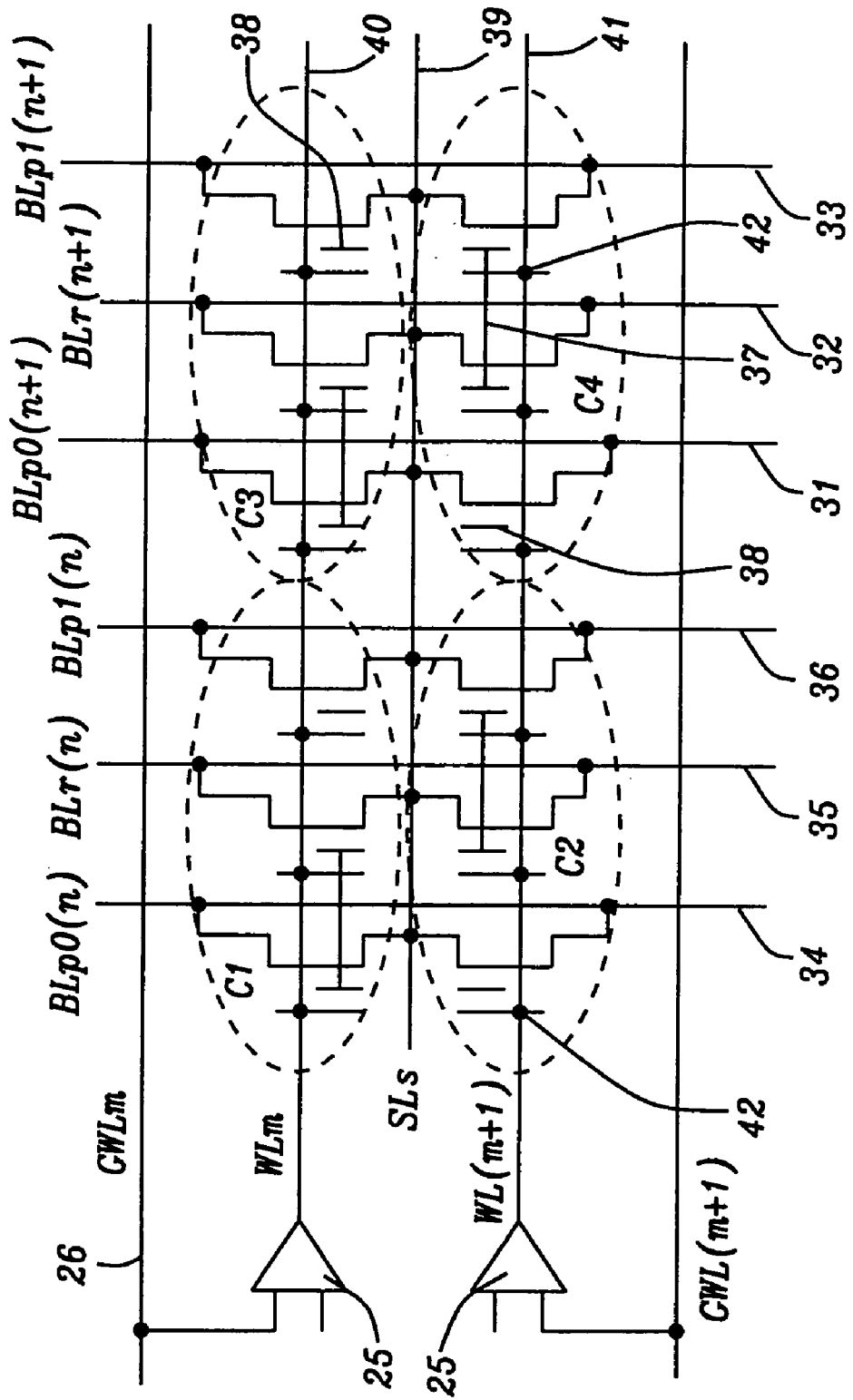
FIG. 6 is a schematic diagram of the present invention for a portion of a nonvolatile memory array for three transistor cells connected to the same source line.

A third embodiment is shown in FIG. 5A in which there are two three-transistor cells C3 and C4 oriented one above the other in a column. The corresponding schematic diagram is shown in FIG. 6. There are three bit lines, two program bit lines 31 and 33 and one read bit line 32. In FIG. 6 the program bit lines are designated as BLp0(n) 34, BLp1(n) 36, BLp0(n+1) 31 and BLp1 (n+1) 33, and the read bit lines are designated as Blr(n) 35 and BLr(n+1) 32. Each cell C1, C2, C3 and C4 contain two split gate transistors, which have a merged floating gate 37. The third transistor in each cell is a split gate transistor separate from the other two and having a self-contained floating gate 38. The third transistor provides a "dummy" function that distributes capacitive loading on the program bit lines. Cells C3 and C4 are reversed mirror images of each other such that the "dummy" transistor is located at the upper right and lower left in FIG. 5A, and identified by the floating gate 38. The cells C1, C2, C3 and C4 in the two rows share the same source line 39. The row containing cells C1 and C3 are connected to a local word line WLm 40 driven by a word line driver 25, which is connected to a global word line GWLm 26. The row containing cells C2 and C4 are connected to a local word line WL(m+1) 41 which is connected to a global word line GWL(m+1). The control gates 42 of all three transistors in each cell connect to the respective word line. Punch-through disturb is eliminated because there are no common program bit lines for cells with common source lines, and reverse tunneling is eliminated by applying a moderate voltage, approximately 1.8V, to the unselected word line.

Figure 5B:
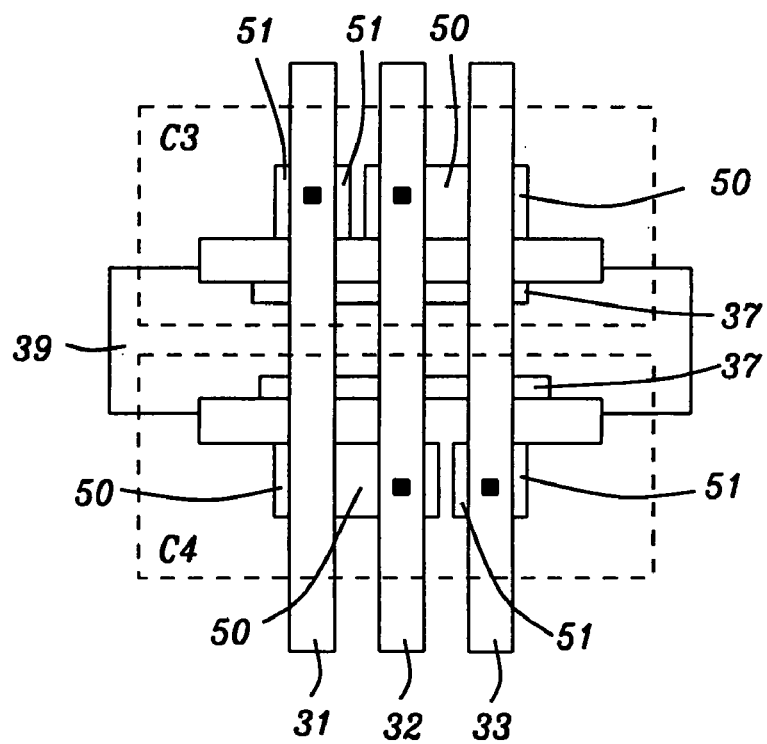

In FIG. 5B is shown a variation on the cell shown in FIG. 5A. The "dummy" cell is eliminated and is replaced by a "fat" cell identified by the wide drain area 50 of the read transistor that is connected to the read bit line 32. The "fat" cell has a wider channel width to provide more channel current. The program transistor connected to the program bit lines 31 and 33 is identified by the thin drain region 51.

In FIG. 7 is shown a schematic diagram of the fourth embodiment of the present invention. The cells C1, C2, C3 and C4 are constructed of two split gate transistors which have merged floating gates. The two rows of cells are selected by word lines WLm and WL(m+1) and have a common source line SLs. In the schematic diagram there is a small square 61 located at the drain 62 of each program transistor. The small square 61 is intended to indicate an additional implant at the drain to increase the Vt of the program transistor. The purpose of the increased Vt is to prevent punch-through disturb. In FIG. 6 there are two program bit lines represented by 34 and 36 for the purpose of separating the program bit lines for the odd and even cells, C1 and C2 for example. In FIG. 7 the extra Vt implant 61 for th program channel will inhibit the punch through disturb; therefore, eliminating the need for separating the program bit lines represented by 34 and 36 in FIG. 6.

In FIG. 8 shows a method of prior art for programming memory cells containing split gates. New data and the associated addresses are loaded into a buffer 80. The address location for the new data is erased 81 and the erase is verified using the read of a marginal "1" MARG1 on each of the erased cells 82. If the verification is not valid 83, then the failing bytes are erased again 84 and verification 82 is again performed. If the verification is good 85, then the new data is programmed into the erased addresses 86. A marginal read of a logical "0" MRG0 is performed to verify the programming of the new data 87. If the verification is not good 88, then the failed bytes are reprogrammed 89, and the reprogrammed locations are again verified 87. If the verification is good 90, then the process is ended 91. In the method shown in FIG. 8, there is no means to determine if unchanged data was disturbed, which allows the procedure to cause errors.

In FIG. 9 is shown a method of the present invention in which unchanged data is verified to remain the same. New data and the associated addresses are loaded into a buffer 100. Original data is read out into a buffer 101. The address location for the new data is erased 102 and the erase operation is verified using the read of a marginal "1" MRG1 on each of the erased cells 103. If the verification is not valid 104, then the failing bytes are erased again 105 and verification 103 is again performed. If the verification is good 106, then the new data is programmed into the erased addresses 107. A marginal read of a logical "0" MRG0 is performed to verify the programming of the new data 108. If the verification is not good 109, then the failed bytes are reprogrammed 110, and the reprogrammed locations are again verified 108. If the verification is good 111, then a marginal read of a logical "1" is performed to verify data remains the same in unchanged data locations 112. If the verification is not good 113, the failed locations are re-written 114 using original data loaded into a buffer in step 101, and the data locations are again verified 112 using a read of a marginal "1". If the verification is good 115, the programming operation is complete 116.

While the invention has been particularly shown and described with reference to preferred embodiments thereof, it will be understood by those skilled in the art that various changes in form and details may be made-without departing from the spirit and scope of the invention.

What is claimed is:

1. A floating gate memory array, comprising:
   a) an array of floating gate memory cells,
   b) a source line coupled to cells in a row of said array,
   c) a word line coupled to control gates of transistors of said memory cells in the row of said array, and
   d) a read bit line and a program bit line connecting between said memory cells in each column of said array,
   wherein a split gate read transistor, a split gate program transistor and a spare split gate transistor form said memory cells.

2. The memory array of claim 1, wherein said word line for the row of memory cells ln said array is segmented and each segment is driven by a word line driver to allow simultaneous memory operations on a number of cells fewer in quantity than that of a complete row.

3. The memory array of claim 1, wherein each row of memory cells in said array is coupled to a unique source line.

4. The memory array of claim 3, wherein said read bit line and said program bit line are merged into one bit line connecting between memory cells in a column.

5. The memory array of claim 1, further comprising:
   a) a split gate read transistor and a split gate program transistor forming said memory cells,
   b) a floating gate of said read transistor connected to the floating gate of said program transistor and thereby merging the two floating gates,
   c) said read bit line connected to a drain of the read transistor,
   d) said program bit line connected to the drain of the program transistor.

6. The memory array of claim 5, wherein said program transistor is given an extra implant to increase threshold voltage to prevent punch-through.

7. The memory array of claim 1, further comprising:
   a) floating gate of said read transistor connected to the floating gate of said program transistor and thereby merging the two floating gates,
   b) said read bit line connected to a drain of the read transistor,
   c) said program bit line formed by a first program bit line and a second program bit line,
   d) said first program bit line connected to the drain of the split gate program transistor,
   e) said second program bit line connected to the drain of the spare split gate transistor.

8. The memory array of claim 7, wherein said memory cell in an adjacent row of a column is formed with the first program bit line connected to the drain of the spare split gate transistor and the second program bit line connected to the drain of the split gate program transistor.

9. The memory array claim 7, wherein said program transistor, said read transistor and said spare transistor are formed with a thin cell.

10. The memory array of claim 7, wherein said memory cells are formed with said split gate read transistor and said split gate program transistor, whereby the first program bit line is connected to the drain of said program transistor and the second program bit line is connected to the program transistor in said memory cell of an adjacent row of the column.

11. The memory array of claim 10, wherein said program transistor is formed with a thin cell and said read transistor is formed with a fat cell.

12. A floating gate memory array, comprising:
   a) an array of floating gate memory cells,
   b) a source line coupled to cells in a row of said array,
   c) a word line coupled to control gates of transistors of said memory cells in said row of said array, and
   d) a read bit line and a program bit line connecting between said memory cells in each column of said array, wherein:
   a split gate read transistor, a split gate program transistor and a spare split gate transistor form said memory cells,
   a floating gate of said read transistor is connected to the floating gate of said program transistor thereby merging the two floating gates,
   said read bit line is connected to a drain of said read transistor,
   said program bit line is formed by a first program bit line and a second program bit line,
   said first program bit line is connected to the drain of said split gate program transistor, and
   said second program bit line is connected to the drain of said spare split gate transistor.

* * * * *